(12) United States Patent
Li et al.

(10) Patent No.: US 7,289,214 B1
(45) Date of Patent: Oct. 30, 2007

(54) SYSTEM AND METHOD FOR MEASURING OVERLAY ALIGNMENT USING DIFFRACTION GRATINGS

(75) Inventors: Guoguang Li, Fremont, CA (US); Shuqiang Chen, Sunnyvale, CA (US); Abdul Rahim Forouhi, Cupertino, CA (US)

(73) Assignee: n&k Technology, Inc., Santa Clara, CA (US)

( * ) Notice: Subject to any disclaimer, the term of this patent is extended or adjusted under 35 U.S.C. 154(b) by 342 days.

(21) Appl. No.: 10/997,210

(22) Filed: Nov. 23, 2004

(51) Int. Cl.
*G01G 11/00* (2006.01)

(52) U.S. Cl. ................................................ 356/401

(58) Field of Classification Search ............... 356/401, 356/614; 250/548; 382/151
See application file for complete search history.

(56) References Cited

U.S. PATENT DOCUMENTS

| | | | | |
|---|---|---|---|---|
| 4,200,395 | A | 4/1980 | Smith et al. ................ 356/356 |
| 4,757,207 | A | 7/1988 | Chappelow et al. ..... 250/491.1 |
| 5,867,276 | A | 2/1999 | McNeil et al. .............. 356/445 |
| 6,023,338 | A | 2/2000 | Bareket ...................... 356/401 |
| 6,694,284 | B1 | 2/2004 | Nikoonahad et al. ....... 702/155 |
| 6,699,624 | B2 | 3/2004 | Niu et al. ....................... 430/5 |
| 6,704,920 | B2 | 3/2004 | Brill et al. .................... 716/19 |
| 6,716,646 | B1 | 4/2004 | Wright et al. ................ 438/14 |
| 6,767,680 | B2 | 7/2004 | Schulz ......................... 430/30 |
| 6,772,084 | B2 | 8/2004 | Bischoff et al. ............ 702/127 |
| 6,778,273 | B2 | 8/2004 | Norton et al. .............. 356/364 |
| 6,778,275 | B2 | 8/2004 | Bowes ....................... 356/400 |
| 6,947,141 | B2* | 9/2005 | Bischoff et al. ............ 356/369 |
| 6,982,793 | B1* | 1/2006 | Yang et al. ................. 356/401 |
| 7,042,569 | B2* | 5/2006 | Sezginer et al. ........... 356/401 |
| 2002/0158193 | A1 | 10/2002 | Sezginer et al. ............ 250/237 |
| 2003/0190793 | A1 | 10/2003 | Brill et al. .................. 438/401 |
| 2004/0066517 | A1 | 4/2004 | Huang et al. ............... 356/509 |
| 2004/0229471 | A1* | 11/2004 | Abdulhalim et al. ....... 438/736 |

OTHER PUBLICATIONS

Weidong Yang et al., "A novel diffraction based spectroscopic method for overlay metrology," Proceedings of SPIE vol. 5038, 2003, pp. 200-207.
Hsu-Ting Huang et al., "Scatterometry-Based Overlay Metrology," Proceedings of SPIE vol. 5038, 2003, pp. 126-137.

* cited by examiner

*Primary Examiner*—Gregory J. Toatley, Jr.
*Assistant Examiner*—Scott M Richey
(74) *Attorney, Agent, or Firm*—Lumen Intellectual Property Services, Inc.

(57) ABSTRACT

A system and method for optical offset measurement is provided. An offset between two grating layers in a compound grating is measured by illuminating the gratings with light having a plane of incidence that is neither parallel with nor perpendicular to the grating lines. This non-symmetrical optical illumination allows determination of the sign and magnitude of the offset. Two measurements are performed at azimuthal angles separated by 180°, and a difference of these measurements is calculated. Measurement of this difference allows determination of the offset (e.g., with a calibration curve). Alternatively, two compound gratings having a predetermined non-zero offset difference can be employed. This arrangement permits determination of the offsets without the need for a calibration curve (or for additional compound gratings), based on a linear approximation.

22 Claims, 10 Drawing Sheets

SYSTEM AND METHOD FOR MEASURING OVERLAY ALIGNMENT USING DIFFRACTION GRATINGS

FIELD OF THE INVENTION

This invention relates to optical measurement of offsets of overlapping grating structures.

BACKGROUND

An important metrology task for applications such as semiconductor photolithography is offset measurement (also known as overlay measurement). Offset measurement is the measurement of a lateral misalignment (i.e., the offset) of one layer relative to another layer. Typically the two layers are parallel to each other and in proximity to each other. For example, one layer can be a patterned metal and/or semiconductor first layer on a substrate and the other layer can be a pattered photoresist second layer deposited on the first layer. Measurement of the alignment of features of the photoresist layer relative to features in the first layer is an important process metric.

Accordingly, many ways have been devised to perform offset measurements. Both imaging and non-imaging approaches for offset measurement have been developed. Imaging approaches are conceptually straightforward, since they are based on analysis of a "picture" directly showing the alignment of the two layers. For example, box-in-box or line-in-line alignment marks are commonly used in the two layers. However, imaging approaches are sensitive to vibrations which can blur the pictures. Such vibrations are difficult to eliminate from a commercial semiconductor processing line. Thus non-imaging approaches, which can be less sensitive to vibration, are presently being investigated.

Many distinct non-imaging optical overlay measurement approaches have been developed to date. For example, scatterometry (or diffraction) approaches are based on illumination of gratings in the two layers and measurement of optical signals from the gratings. Analysis of the measured optical signals can be used to determine the offset. It is important to distinguish methods which are based on optical diffraction from methods which only work in the absence of diffraction (e.g., when the features being probed are much larger than an optical wavelength). U.S. Pat. No. 4,757,207 by Chappelow et al. is an example of such a non-diffraction approach. Thus in the following considerations, "grating" refers to a periodic structure having a period on the order of an optical wavelength or smaller.

Generally, it is important to determine both the sign and the magnitude of the offset. Determination of the sign of the offset via scatterometry is an issue which is appreciated by some art workers, but not by others.

In U.S. Pat. No. 4,200,395 by Smith et al., diffracted beams in equal and opposite orders (e.g., +1 and −1 orders) are measured. This approach provides enough information to resolve potential sign ambiguities. However, it is often preferable to make use of the zero order diffracted beam, since the zero order beam is often the most intense diffracted beam and provides the best signal. Another disadvantage of the approach of Smith et al. is that it is difficult to perform the required measurements over a wide wavelength range because the angle at which a diffracted beam is emitted depends on wavelength for all orders other than zero order.

In U.S. Pat. No. 6,699,624 by Niu et al., overlay measurement via scatterometry is considered, but there is no discussion of how sign information is obtained. Modeled results are presented including sign information. This sign information may possibly be obtained from analysis of optical signals from test patterns having multiple grating orientations. For example, these orientations can be horizontal (0°), vertical (90°), +45° and −45°. In this work, the nominal alignment (i.e., the alignment having zero offset) is when the two gratings are aligned. More specifically, the lines in the second grating are aligned with either the lines in the first grating or the spaces in the first grating. The use of multiple grating orientations to resolve the sign ambiguity (e.g., 4 grating orientations to determine 2 orthogonal offset magnitudes and signs) is undesirable, since it requires more chip area than an approach which only requires one grating orientation.

Sign determination is considered more explicitly in U.S. Pat. No. 6,772,084 by Bischoff et al. In this work, the preferred nominal alignment is when the two gratings are offset by about a quarter period. By selecting this nominal alignment, the sensitivity of the zeroth order reflection to changes in the offset is improved, and sign information is more readily available from the zeroth order reflection signal. In this work, the symmetry that often leads to equal zeroth order diffraction signals for positive and negative offsets having the same magnitude is broken by making the compound grating formed by the two gratings asymmetric at zero offset. However, the use of an asymmetric nominal alignment can lead to complications in practice that would be avoided if the nominal grating alignment were symmetric. Gratings having a nominal alignment offset of about a quarter period are also considered by Yang et al. in an article entitled "A novel diffraction based spectroscopic method for overlay metrology" in Proc. SPIE v5038 pp. 200-207.

An approach where two stacked gratings having equal and opposite offsets at nominal alignment is considered by Huang et al. in an article entitled "Symmetry-Based overlay metrology" in Proc. SPIE v5038 pp. 126-137. The difference in reflectance between the two stacked gratings is a measure of both the sign and magnitude of the offset. For sufficiently small offsets, this reflectance difference is approximately a linear function of offset. This approach requires provision of sufficient chip area for two stacked gratings. It would be preferable to obtain the sign and magnitude of the offset with a single stacked grating.

Asymmetric gratings for scatterometry are also considered in US 2002/0158193 by Sezginer et al. In this work, the first and/or second gratings are individually asymmetric in order to further reduce the offset sign ambiguity. Detailed modeling is performed in order to determine the offset from the measured signals. However, the use of asymmetric gratings in this approach can lead to significant complications in the calculations for determining the offset. Since rapid results are frequently required in a production environment, it is desirable to reduce modeling time, and even more desirable to eliminate modeling entirely.

Accordingly, it would be an advance in the art to provide scatterometry for determining both sign and magnitude of an offset that provides rapid results by reducing modeling calculations. Another advance in the art would be to provide scatterometry for determination of the sign and magnitude of the offset from a nominally symmetric arrangement of two overlapping gratings.

SUMMARY

These advances are provided by the present invention, where an offset between two grating layers in a compound grating is measured by illuminating the gratings with light having a plane of incidence that is neither parallel with nor perpendicular to the grating lines. This non-symmetrical optical illumination allows determination of the sign and magnitude of the offset. Two measurements are performed at azimuthal angles separated by 180°, and a difference of these measurements is calculated. Measurement of this difference allows determination of the offset (e.g., with a calibration curve). Alternatively, two compound gratings having a predetermined non-zero offset difference can be employed. This arrangement permits determination of the offsets without the need for a calibration curve, based on a linear approximation.

DETAILED DESCRIPTION

Figure 1:
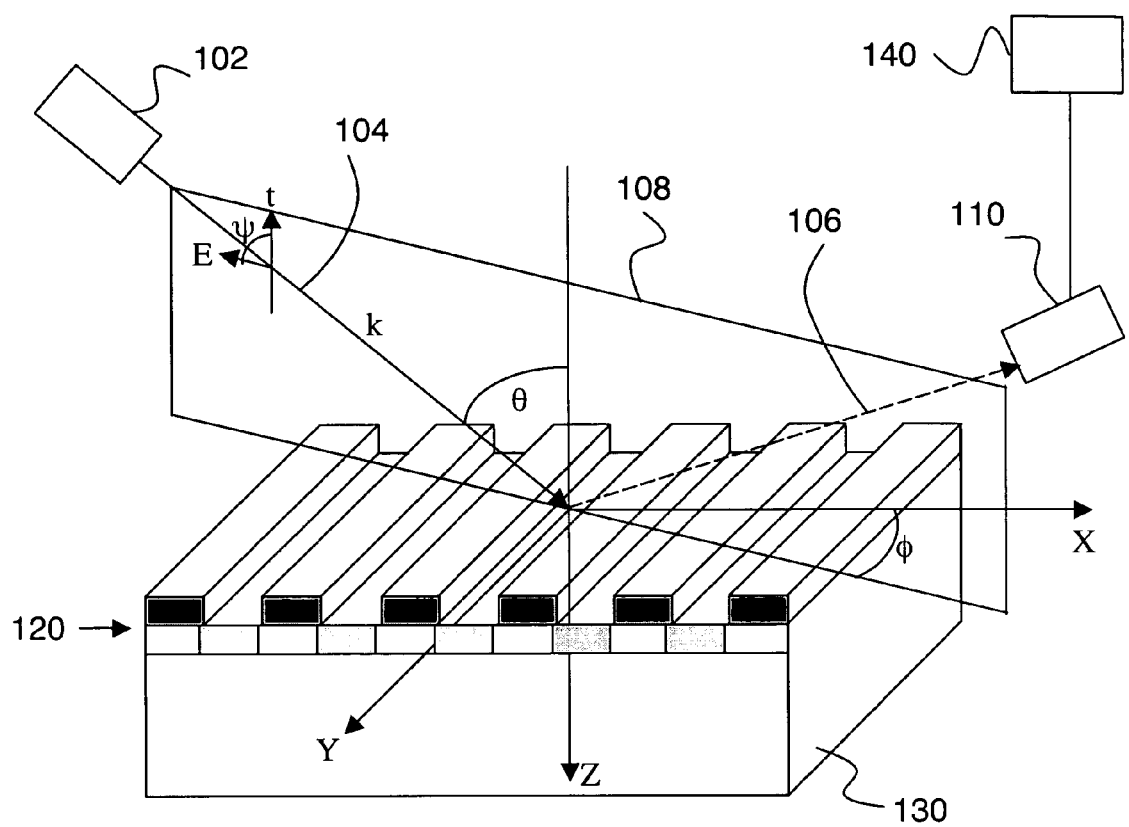
FIG. 1 shows light incident on a two-layer diffraction grating according to an embodiment of the invention.

FIG. 1 shows light incident on a two-layer diffraction grating according to an embodiment of the invention. An optical source 102 emits light 104 which is incident on a diffraction grating 120. Grating 120 is a compound grating having two or more layers and is disposed on a substrate 130. The lines of each layer of grating 120 are perpendicular to a common grating axis. Light diffracted from grating 120 is received by a detector 110. Diffracted light from grating 120 can include specularly reflected light (also known as zero order reflected light), non-specularly reflected light (i.e., +/−n order reflected light, n>0), specularly transmitted light (also known as zero order transmitted light), and non-specularly transmitted light (i.e., +/−n order transmitted light, n>0). Detector 110 receives one or more of these diffracted light components and provides an optical response to a processor 140. Light 104 is incident on grating 120 at an angle of incidence θ greater than zero. A plane of incidence 108 of the incident light makes an azimuthal angle φ with respect to a grating axis perpendicular to the grating lines. In the coordinates of FIG. 1, the grating axis is the X axis, the grating lines are parallel to the Y axis, and grating 120 is parallel to the X-Y plane. The two layers of grating 120 have the same grating axis, as shown on FIG. 1.

A key feature of the present invention is that the azimuthal angle φ is not an integer multiple of 90°. In other words, the plane of incidence is neither parallel with nor perpendicular to the grating lines. Preferably, φ is about 45° as indicated in more detail below. Grating 120 is thus illuminated asymmetrically, and this asymmetric illumination enables determination of both sign and magnitude of an offset between the grating layers.

In a preferred embodiment of the invention, two optical responses from zero order (i.e., specularly reflected) light received by detector 110 are measured: a first optical response at an azimuthal angle $\phi_1$ that is not an integer multiple of 90°, and a second optical response at an azimuthal angle $\phi_2=\phi_1+180°$. Processor 140 provides a difference of these two optical responses. This difference depends, in part, on the offset between the two grating layers. For example, if the two layers of grating 120 have the same period and are symmetrically aligned (i.e., have zero offset), the difference will be zero. For non-zero offset, the sign of the difference will depend on the sign of the offset, as shown in the following examples.

The two azimuthal angles $\phi_1$ and $\phi_2$ can be provided by azimuthally rotating source 102 and detector 110 with respect to grating 120 (e.g., with a rotatable instrument head, not shown), and/or by azimuthally rotating grating 120 with respect to source 102 and detector 110 (e.g., with a rotatable sample stage, not shown).

Figure 1A:
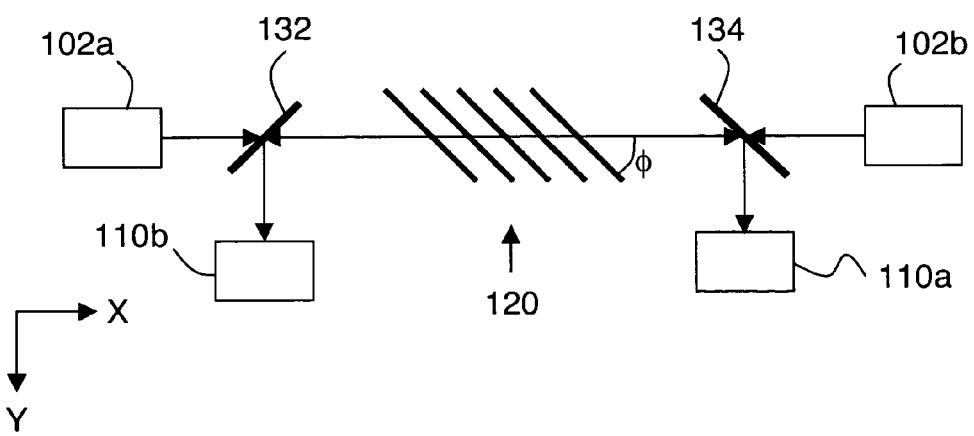
FIG. 1a shows an alternative arrangement of sources and detectors for illuminating a grating according to an embodiment of the invention.

FIG. 1a shows an alternative arrangement, where no relative motion is required to obtain the first and second responses. Sources 102a and 102b provide light directed to grating 120 in opposite directions. Light incident on grating 120 has an azimuthal angle of about 45° in this example. Beamsplitters 132 and 134 are inserted into the optical beam paths such that light from source 102b diffracted by grating 120 is received by detector 110b and light from source 102a diffracted by grating 120 is received by detector 110a.

Figure 1B:
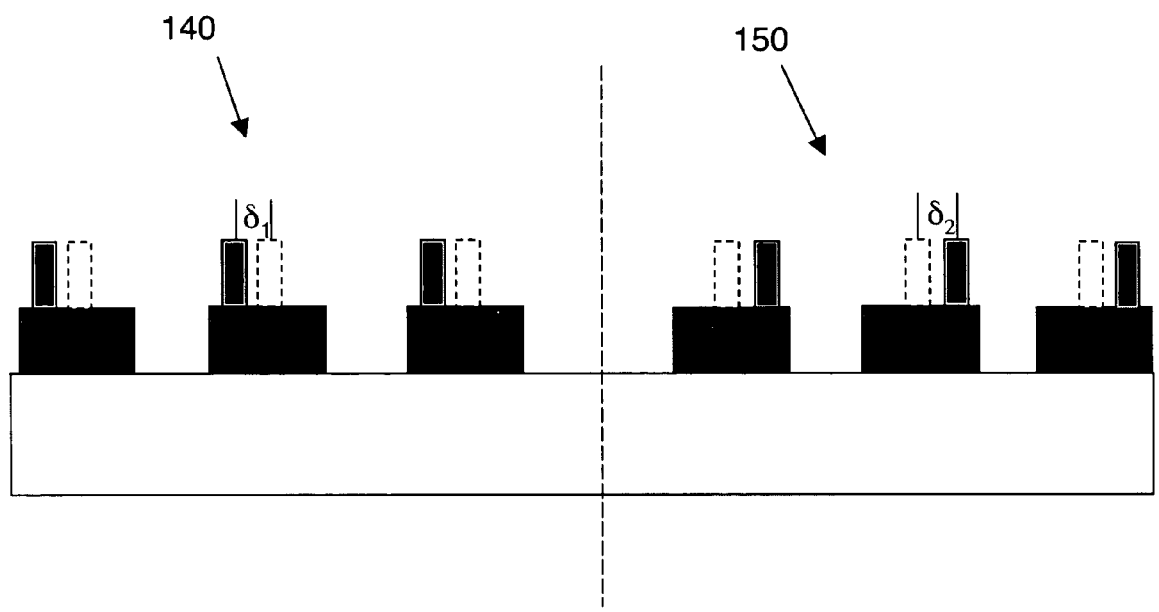
FIG. 1b shows a mirror-image pair of diffraction gratings.

To better appreciate the present invention, it is helpful to compare it to prior art approaches that employ two mirror-image gratings to obtain offset sign and magnitude information (e.g., as in U.S. Pat. No. 6,772,084 or in the above-cited Huang et al. reference). FIG. 1b shows an example of such mirror image gratings. Gratings 140 and 150 have equal and opposite offsets at the nominal alignment. In this prior art approach, light is incident on both gratings at an azimuthal angle of 0° (i.e., the plane of incidence is perpendicular to the grating lines). A difference $\Delta R=R_1-R_2$ is formed, where $R_1$ is the zero order reflectance from grating 140 and $R_2$ is the zero order reflectance from grating 150. The difference $\Delta R$ is zero at the nominal alignment (i.e., $\delta_1=\delta_2$). The sign and magnitude of the offset between grating layers can be determined from $\Delta R$ (e.g., with a calibration curve). Thus the present invention provides offset determination with two measurements on the same grating, while this prior art approach requires measurements on two different gratings (which requires more chip area) to provide the same information.

Figure 2:
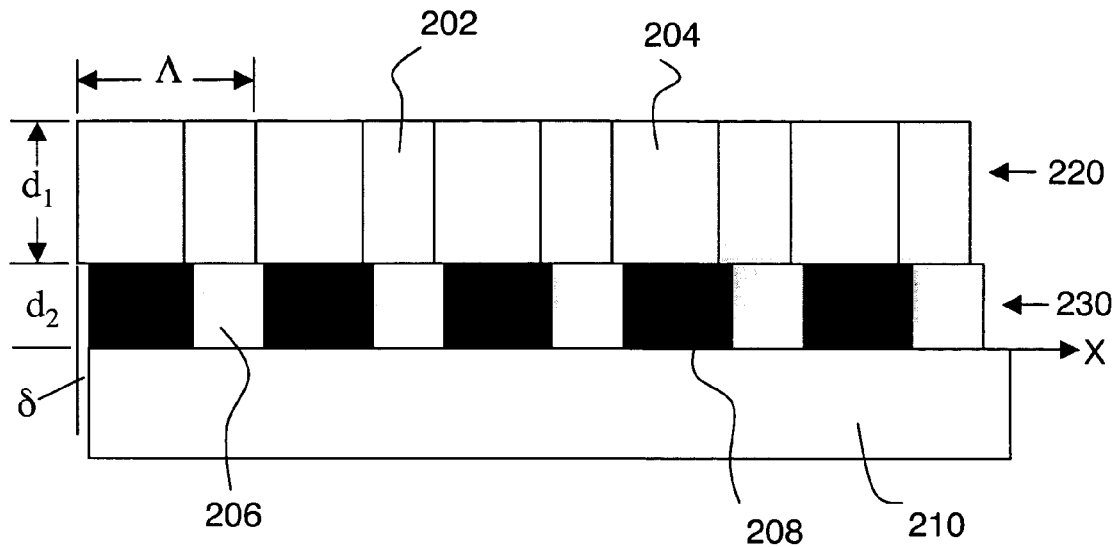
FIG. 2 shows a first exemplary two-layer diffraction grating having an offset between the layers.

FIG. 2 shows a first exemplary two-layer diffraction grating having an offset δ between the layers. The grating of FIG. 2 has a lower layer 230 with metal (Cr) lines 208 and photoresist spaces 206 and has a line:space ratio of 6:4 and a thickness $d_2$=300 nm. An upper layer 220 of the grating of FIG. 2 includes air spaces 204 and photoresist lines 202 and has a line:space ratio of 4:6 and a thickness $d_1$=500 nm. The period (or pitch) Λ of both layers is 500 nm. Substrate 210 is quartz. In the following, we refer to gratings having two or more grating layers which define one or more offsets as "compound gratings". Thus the grating of FIG. 2 is an exemplary compound grating. Throughout the remainder of this description, the offset δ is taken to be positive if the upper grating layer is displaced in the +X direction relative to the lower grating layer on FIG. 2. Thus the offset shown on FIG. 2 is negative.

Figure 3:
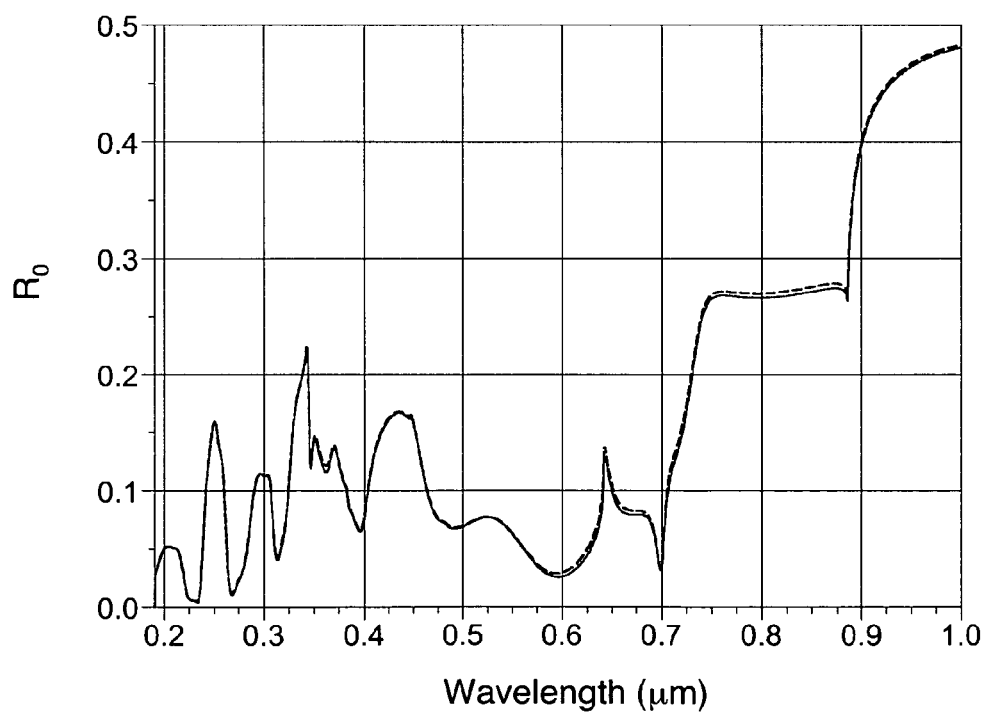
FIG. 3 shows calculated zeroth order reflectance from the grating of FIG. 2 according to an embodiment of the invention.

FIG. 3 shows calculated zeroth order reflectance $R_0$ vs. wavelength from the grating of FIG. 2 for δ=2.5 nm (dashed line) and for δ=−2.5 nm (solid line) according to an embodiment of the invention. In the calculations of FIG. 3, θ=ϕ=45° and s-polarized incident light (i.e., having an electric field perpendicular to the plane of incidence) is assumed. The difference in the two curves of FIG. 3 is due to the asymmetric illumination of the gratings in this example.

Figure 4:
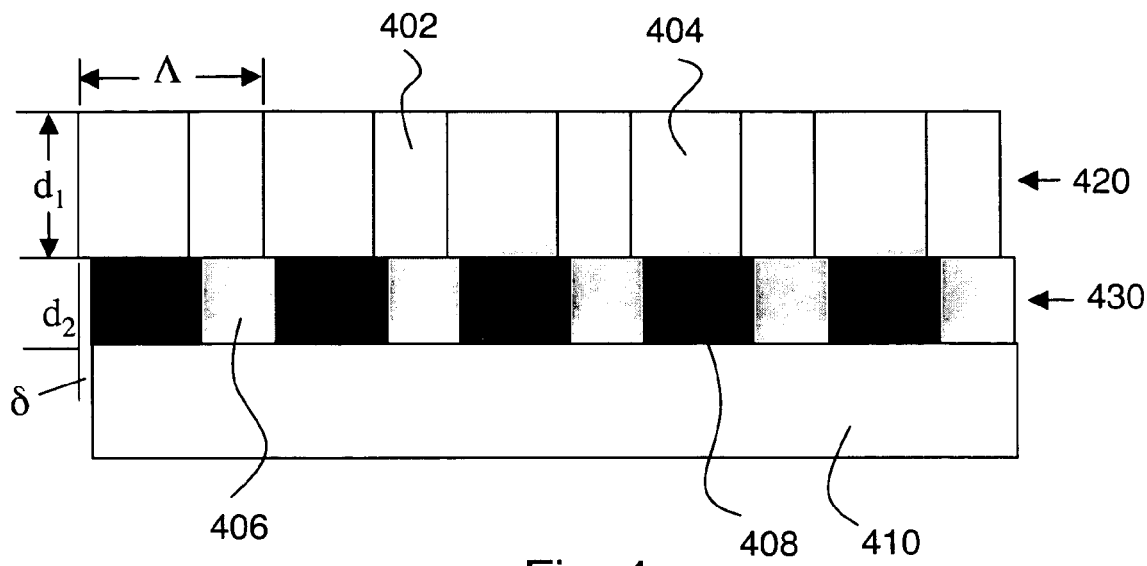
FIG. 4 shows a second exemplary two-layer diffraction grating having an offset between the layers.

FIG. 4 shows a second exemplary two-layer diffraction grating having an offset δ between the layers. The grating of FIG. 4 has a lower layer 430 with metal (Cr) lines 408 and photoresist spaces 406 and has a line:space ratio of 6:4 and a thickness $d_2$=300 nm. An upper layer 420 of the grating of FIG. 4 includes photoresist lines 404 and air spaces 402 and has a line:space ratio of 6:4 and a thickness $d_1$=500 nm. The period (or pitch) Λ of both layers is 500 nm. Substrate 410 is quartz.

Figure 5:
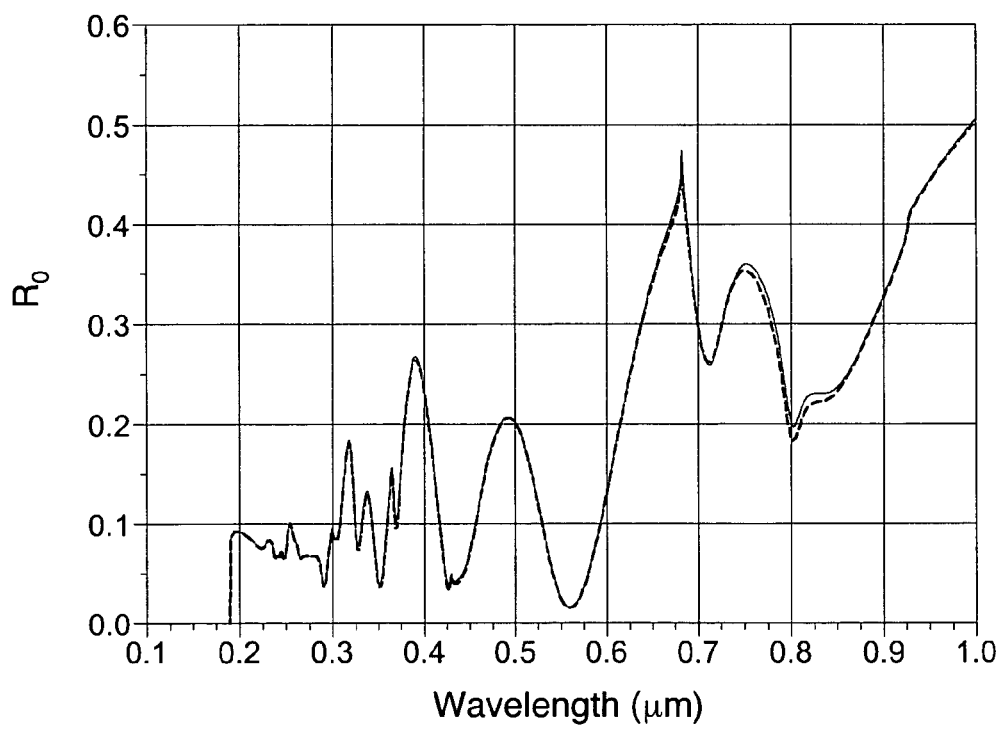
FIG. 5 shows calculated zeroth order reflectance from the grating of FIG. 4 according to an embodiment of the invention.

FIG. 5 shows calculated zeroth order reflectance $R_0$ vs. wavelength from the grating of FIG. 4 for δ=10 nm (dashed line) and for δ=−10 nm (solid line) according to an embodiment of the invention. In the calculations of FIG. 5, θ=4=45° and s-polarized incident light is assumed. The difference in the two curves of FIG. 5 is due to the asymmetric illumination of the gratings in this example.

The gratings of FIGS. 2 and 4 are referred to as "line-on-space" and "line-on-line" gratings respectively. In a line-on-line grating (e.g., FIG. 4), the lines of the two gratings are nominally aligned at zero offset. In a line-on-space grating (e.g., FIG. 2) the lines of one grating are nominally aligned with the spaces of the other grating at zero offset. The reflectance $R_0$ is a more sensitive function of offset (by about a factor of 4) for the line-on-space grating of FIGS. 2 and 3 than for the line-on-line grating of FIGS. 4 and 5. This difference is attributed to the generally higher index contrast of a line-on-space grating compared to a line-on-line grating. In these examples, Cr and air on FIG. 2 have a large index contrast which improves measurement sensitivity (i.e., the dependence of $R_0(λ)$ on offset δ). Accordingly, it is preferred to practice the invention with a line-on-space nominal grating alignment. For both line-on-space and line-on-line nominal grating alignment, the compound grating has reflection symmetry in a plane perpendicular to the grating axis at zero offset. A non-zero offset breaks this symmetry.

Figure 6:
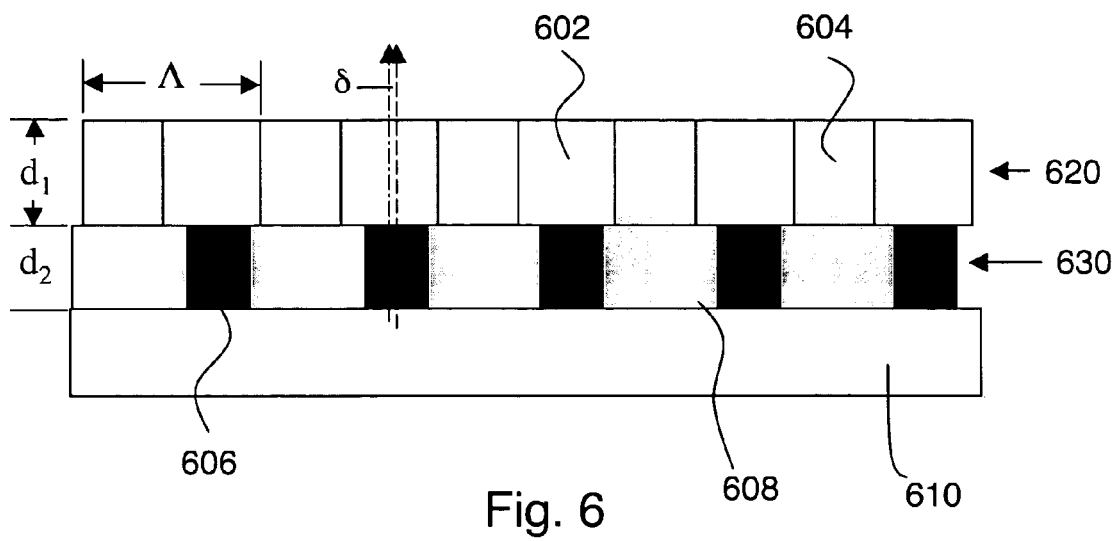
FIG. 6 shows a third exemplary two-layer diffraction grating having an offset between the layers.

FIG. 6 shows a third exemplary two-layer diffraction grating having an offset δ between the layers. The grating of FIG. 6 has a lower layer 630 with poly-silicon lines 606 and BPSG (Borophosphosilicate Glass) spaces 608 and has a line:space ratio of 3.5:6.5 and a thickness $d_2$=300 nm. An upper layer 620 of the grating of FIG. 6 includes photoresist lines 604 and air spaces 602 and has a line:space ratio of 4:6 and a thickness $d_1$=500 nm. The period (or pitch) Λ of both layers is 500 nm. Substrate 610 is silicon.

Figure 7:
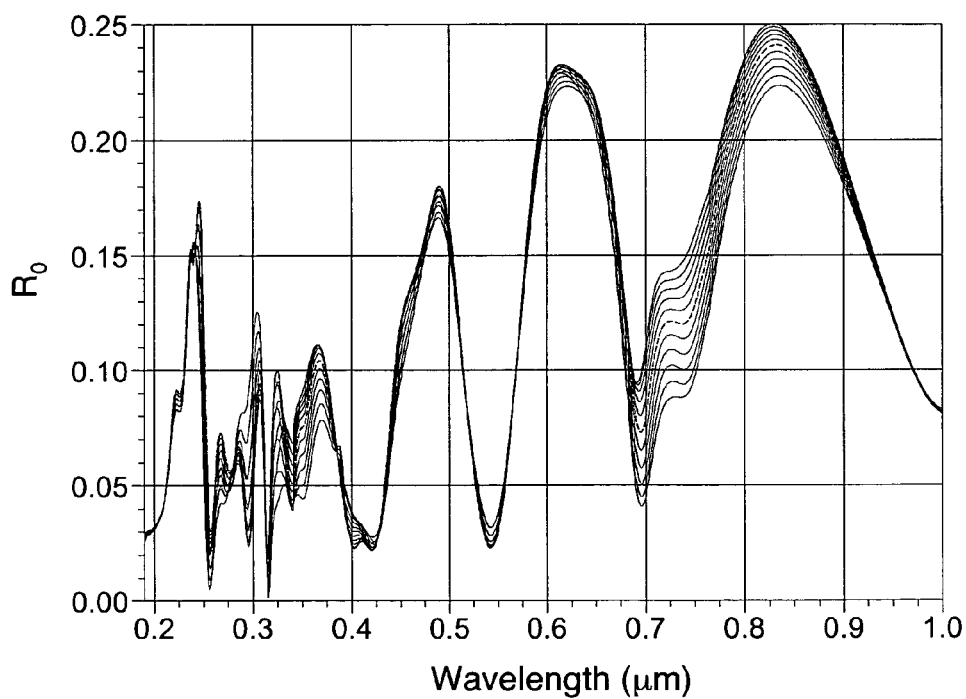
FIG. 7 shows calculated zeroth order reflectance from the grating of FIG. 6 according to an embodiment of the invention.

FIG. 7 shows calculated zeroth order reflectance $R_0$ vs. wavelength from the grating of FIG. 6 for δ=0 nm (dashed line), for δ=−50, −40, −30, −20, and −10 nm (lower five solid lines) and for δ=50, 40, 30, 20, and 10 nm (upper five solid lines) according to an embodiment of the invention. In the calculations of FIG. 7, θ=ϕ=45° and s-polarized incident light is assumed. On FIG. 7, it is apparent that the separation between curves is wavelength dependent. Accordingly, it is preferred to select a wavelength or wavelength range (for averaging) where the separation between curves is a relatively sensitive and linear function of the offset δ. For the example of FIG. 7, a suitable wavelength range is from about 701 nm to about 740 nm. In this example, other wavelength ranges can also be chosen (e.g., 350 to 370 nm). For other grating structures, suitable wavelength ranges can be different. Determination of such different wavelength ranges for other grating structures is straightforward, and practice of the invention does not depends critically on the wavelength or wavelength range selected. We define $R_l$ to be $R_0$ when ϕ=45°, and $R_r$ to be $R_0$ when ϕ=225°. Thus $R_l$ corresponds to light incident from the left on FIG. 1, and $R_r$ corresponds to light incident from the right on FIG. 1.

Figure 8:
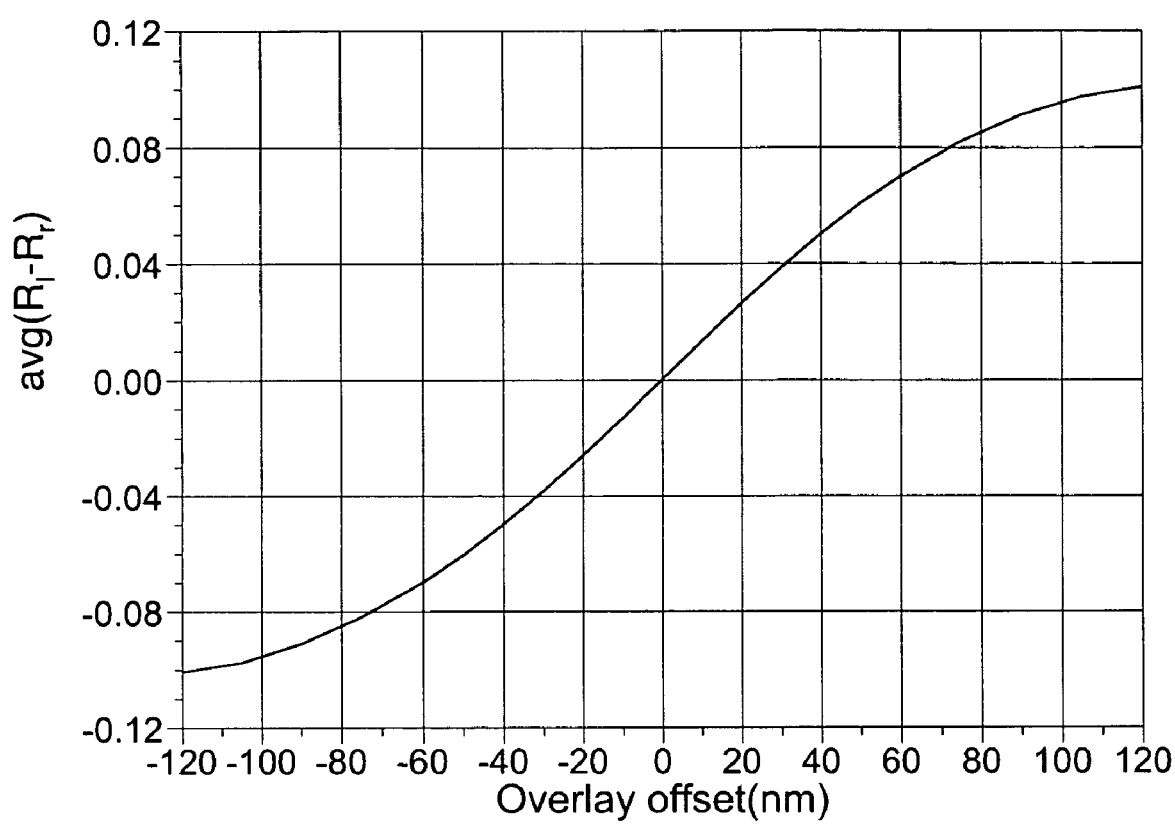
FIG. 8 is a plot of $R_1$-$R_r$ from the grating of FIG. 6 averaged over a wavelength range from 701 nm to 740 nm according to an embodiment of the invention.

FIG. 8 is a plot of $R_l$-$R_r$ from the grating of FIG. 6 averaged over the wavelength range from 701 nm to 740 nm. The reflectance difference is a nearly linear function of offset for |δ|≤about 35 nm. In the calculations of FIG. 8, θ=45° and ϕ=45° or 225° and s-polarized incident light is assumed.

There are various ways to use such reflectance difference information to determine offset according to the invention. For example, the result of FIG. 8 can be used as a calibration curve for the grating of FIG. 6. A measurement of averaged $R_l$-$R_r$ can be related to the corresponding offset by processor 140 (e.g., by a table lookup and/or interpolation based on the result of FIG. 8). Offsets as large as ±100 nm can be measured in this manner. Although this approach is straightforward, it suffers from the drawback that calculation of a calibration curve (as in FIG. 8) can be significantly time-consuming. An alternative approach employs two different compound gratings to provide offset measurement without having to compute a calibration curve as in FIG. 8.

Figure 9:
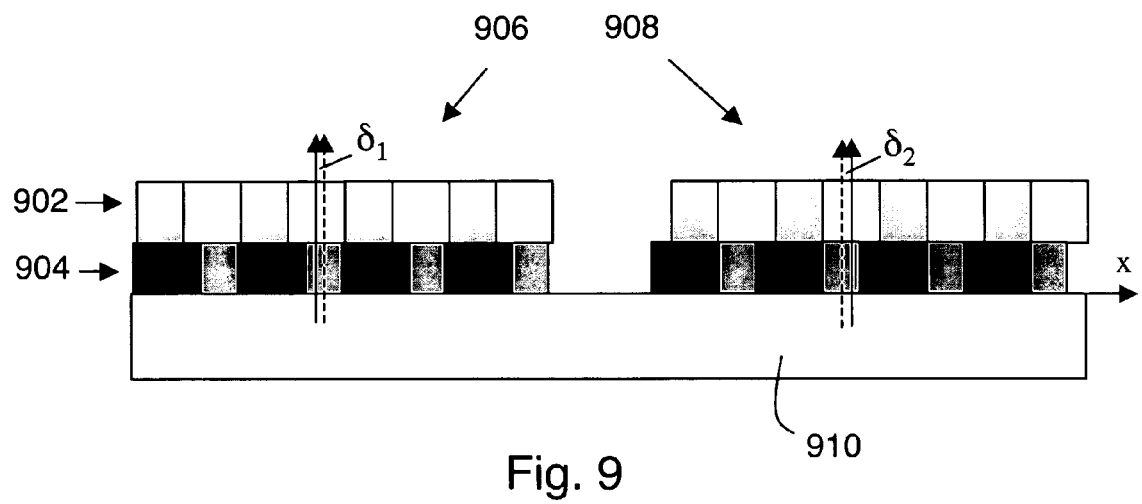
FIG. 9 shows a fourth exemplary two-layer diffraction grating having two gratings in each layer defining two layer offsets according to an embodiment of the invention.

FIG. 9 shows a fourth exemplary two-layer diffraction grating having two gratings in each layer defining two layer offsets according to an embodiment of the invention. On FIG. 9, layers 902 and 904 are disposed on a silicon substrate 910. These layers are arranged such that two compound gratings 906 and 908 are formed. Each compound grating in this example has the structure of the grating of FIG. 6. The only difference between gratings 906 and 908 is in the offsets $δ_1$ and $δ_2$. More specifically, an offset difference $Δ=δ_2-δ_1$ is lithographically defined in a single mask layer (e.g., in the mask defining the features of layer 902). Since Δ is determined by a single mask-layer, it can be regarded as a known predetermined quantity in the following considerations. A consistent sign convention should be used for $δ_1$ and $δ_2$. In the example of FIG. 9, $δ_1$ is negative and $δ_2$ is positive.

Figure 10:
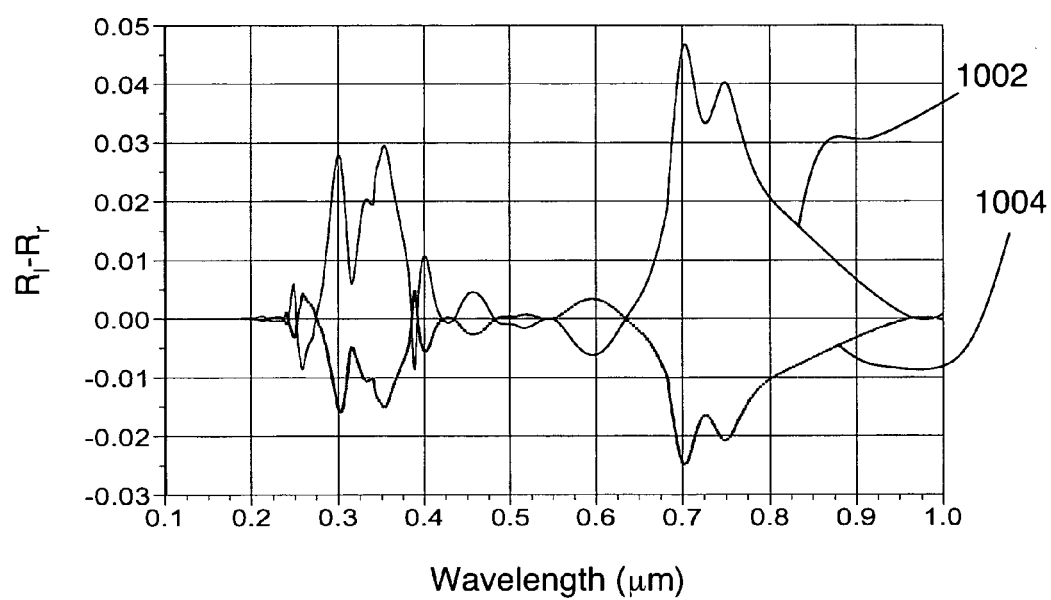
FIG. 10 is a plot of $R_1$-$R_r$ from the two compound gratings of FIG. 9 according to an embodiment of the invention.

FIG. 10 is a plot of calculated $ΔR=R_l-R_r$ from the two compound gratings of FIG. 9 according to an embodiment of the invention. In this example, $δ_1$=−15 nm and $δ_2$=30 nm (so Δ=45 nm), line 1002 is the reflectance difference from grating 908 and line 1004 is the reflectance difference from grating 906. In the calculations of FIG. 10, θ=45° and ϕ=45° or 225° and s-polarized incident light is assumed. Here also it is helpful to average over a wavelength range from 701 to 740 nm, which gives $ΔR_1$=0.01965 and $ΔR_2$=0.03839. Thus this example provides two ΔR values corresponding to two offsets having a known difference (i.e., Δ). This arrangement of gratings is helpful for determining offsets from ΔR measurements without using a calibration curve.

More specifically, we assume measurements have provided the averaged $\Delta R_1$ and $\Delta R_2$ values given above, and that Δ=45 nm is known from the mask design. The offsets $\delta_1$ and $\delta_2$ can be approximately determined from this information. First a slope $s=(\Delta R_2-\Delta R_1)/\Delta$ is calculated. In this example, s=0.0012898/nm. Second, it is assumed that ΔR is approximately a linear function of δ that has slope s and passes through the point (0,0). These features are both seen on FIG. 8 (for sufficiently small δ). Based on this linear assumption, estimates for the offsets are given by $\delta_1=\Delta R_1/s$ and $\delta_2=\Delta R_2/s$. In this example, numerical values for these estimates are $\delta_1$=−15.23 nm and $\delta_2$=29.76 nm. These estimates are close approximations to the true offset values given above.

A key feature of this preferred embodiment of the invention is that these offset estimates are obtained with minimal calculations. There is no need to perform detailed modeling calculations to estimate offset. In practicing this embodiment, two considerations should be balanced against each other. If the offset difference Δ is too small, accuracy will be lost because of loss of precision in forming a difference of two nearly equal quantities (i.e., $\Delta R_1$ and $\Delta R_2$). If the offset difference Δ is too large, accuracy will be lost because of increasing nonlinearity at large offsets. Thus Δ is preferably selected to be a suitable intermediate value. Such selection in any particular case is straightforward. For example, curves such as in FIG. 8 can be calculated (for a specific sample design) to estimate the range of approximate linearity of ΔR vs. δ and to guide selection of an appropriate wavelength or wavelength range. Another noteworthy consideration is that increasing the period of the sample grating tends to increase the linear range, but tends to decrease the precision of the measurement. So the grating period can be optimized when designing samples for measuring different ranges of overlay offsets. Such different offset ranges may result from characteristics of various fabrication processes.

Another noteworthy point is that the wavelength range over which averaging is performed to determine $\Delta R_1$ and $\Delta R_2$ has no direct effect on the offset estimates. Wavelength range averaging is preferred (to increase signal to noise ratio), but not required, when practicing the invention.

In the examples thus far, the angle of incidence θ has been 45°. The invention can be practiced with any non-zero angle of incidence, although an angle of incidence from about 40° to about 50° is preferred.

Figure 11A:
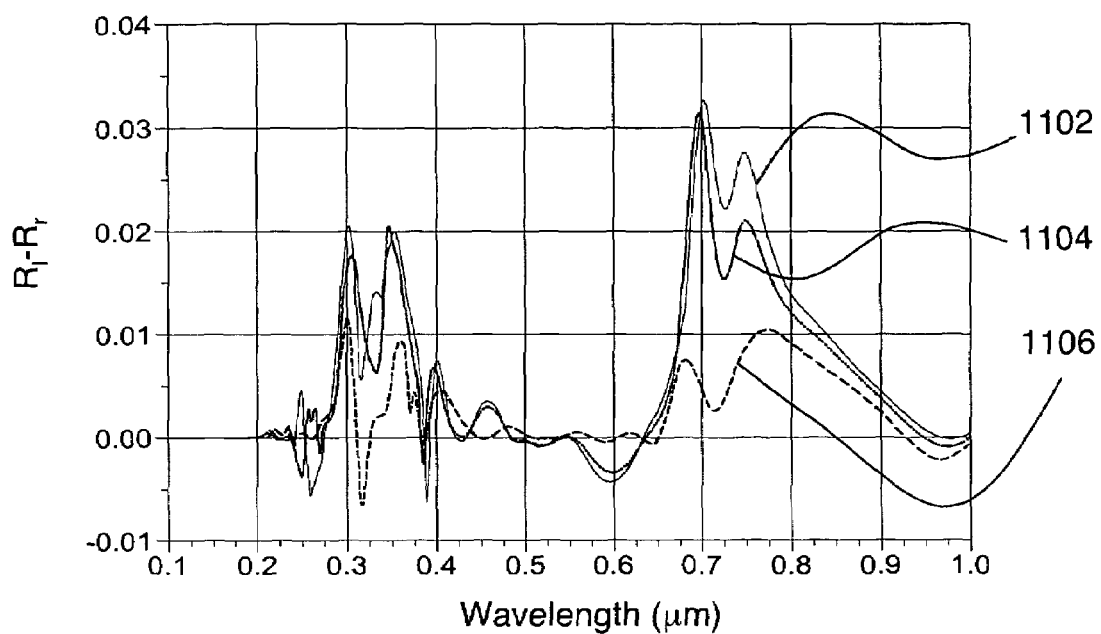
FIGS. 11a-b are plots of $R_1$-$R_r$ from the compound grating of FIG. 6 for various angles of incidence θ.
Figure 11B:
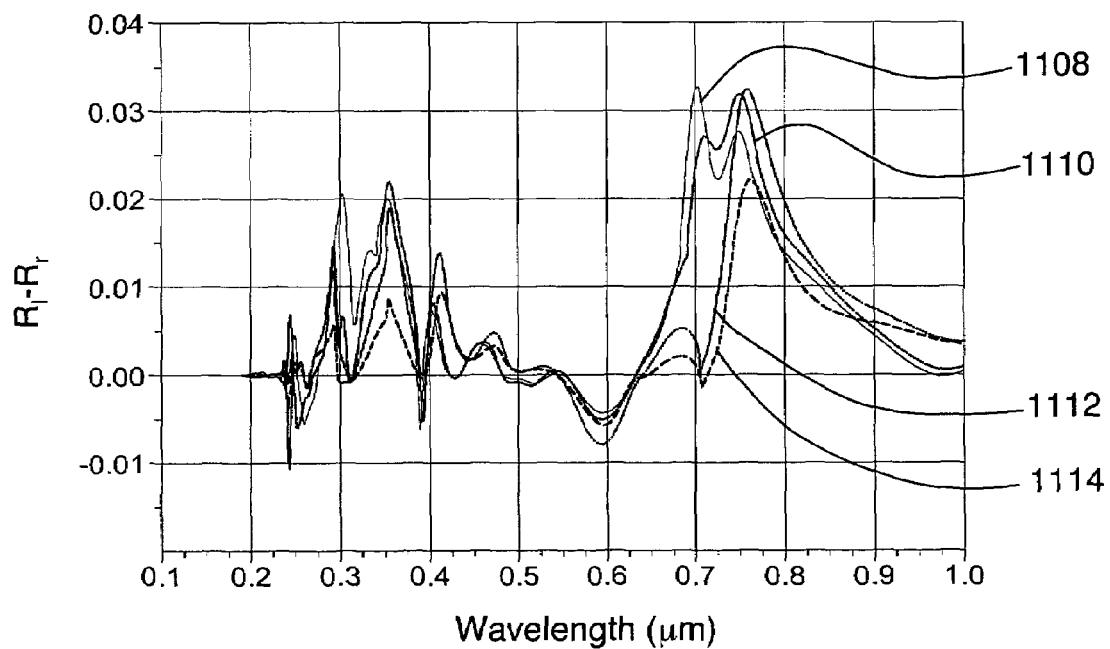

FIGS. 11a-b show calculated $\Delta R=R_l-R_r$ for δ=20 nm and $\phi$=45° ($R_l$) and 225° ($R_r$) for the grating of FIG. 6, where s-polarized incident light is assumed. Lines 1102, 1104, and 1106 on FIG. 11a correspond to θ=45°, 40°, and 30° respectively. Lines 1108, 1110, 1112, and 1114 on FIG. 11b correspond to θ=45°, 50°, 60°, and 70° respectively. The reflectance difference ΔR in this example tends to increase with θ for θ<about 45° (FIG. 11a) and tends to decrease with θ for θ> about 45° (FIG. 11b), which accounts for the above stated preference for an angle of incidence from about 40° to about 50°.

In the examples thus far, the azimuthal angles $\phi$ have been 45° (and 225°). The invention can be practiced with any azimuthal angle that is not a multiple of 90°, although azimuthal angles which are about equal to odd multiples of 45° are preferred.

Figure 12A:
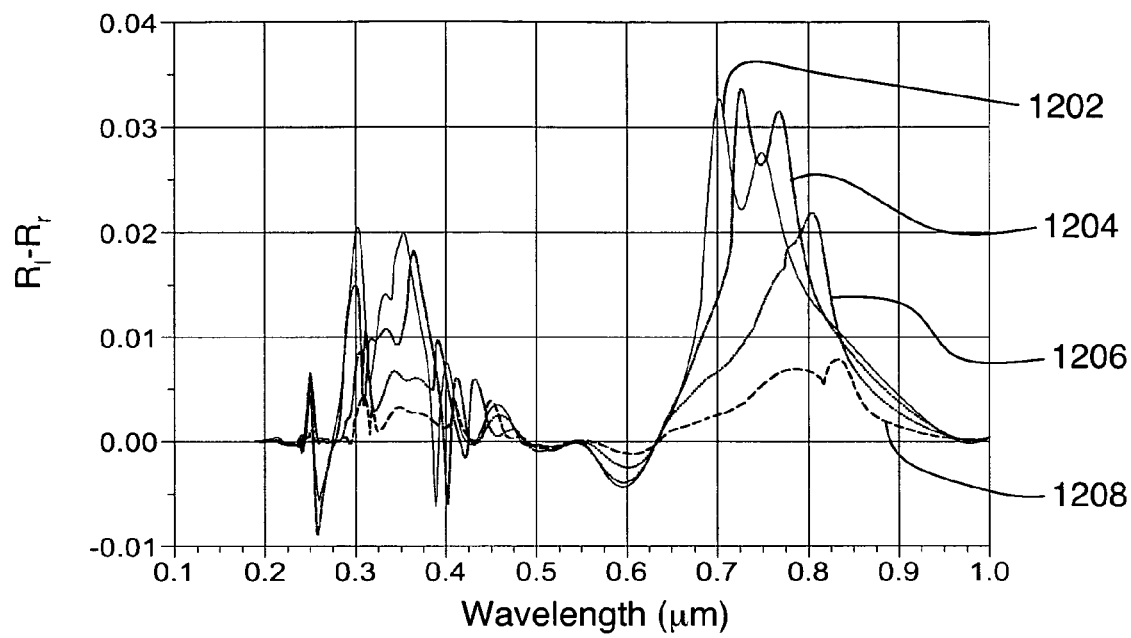
FIGS. 12a-b are plots of $R_1$-$R_r$ from the compound grating of FIG. 6 for various azimuthal angles φ.
Figure 12B:
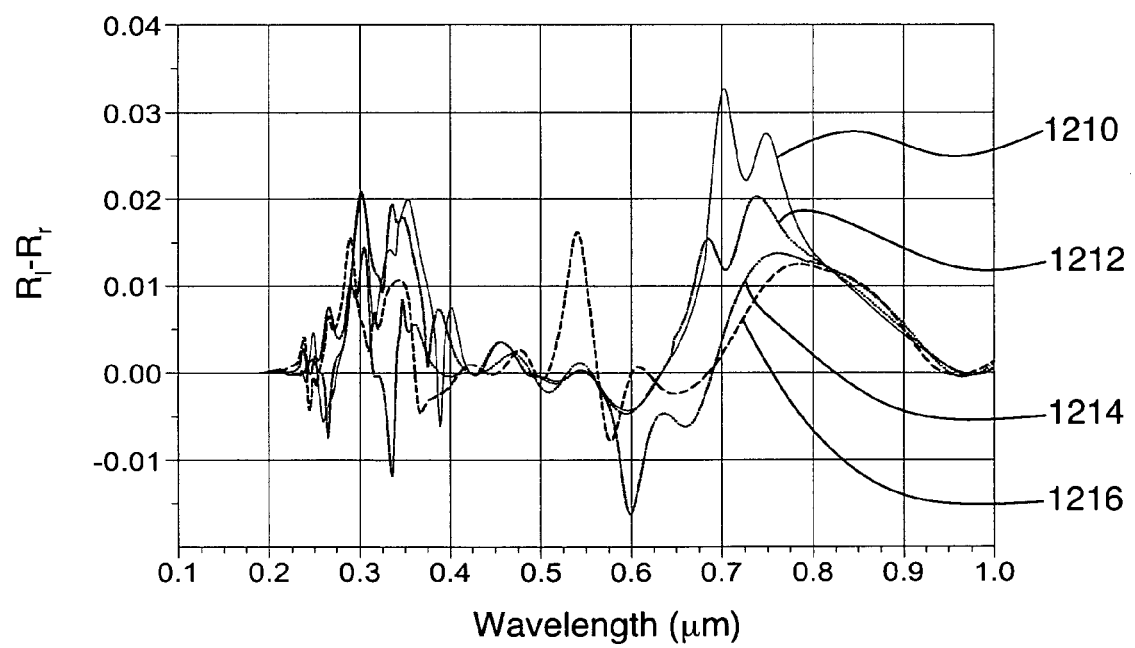

FIGS. 12a-b show calculated $\Delta R=R_l-R_r$ for δ=20 nm and θ=45° with s-polarization for the grating of FIG. 6. Lines 1202, 1204, 1206, and 1208 on FIG. 12a correspond to $\phi_1$=45°, 40°, 30°, and 20° respectively. Lines 1210, 1212, 1214, and 1216 on FIG. 12b correspond to $\phi_1$=45°, 50°, 60°, and 70° respectively. In all cases, $\phi_2=\phi_1+180°$. The reflectance difference ΔR in this example tends to increase with $\phi_1$ for $\phi_1$<about 45° (FIG. 12a) and tends to decrease with $\phi_1$ for $\phi_1$> about 45° (FIG. 12b), which accounts for the above stated preference for an azimuthal angle which is about equal to an odd multiple of 45°.

In the examples thus far, we have assumed $\phi_2=\phi_1+180°$ exactly. In practice, this relation may not be perfectly achieved, so we investigate the sensitivity of the offset measurement to an error in this 180° angle.

Figure 13:
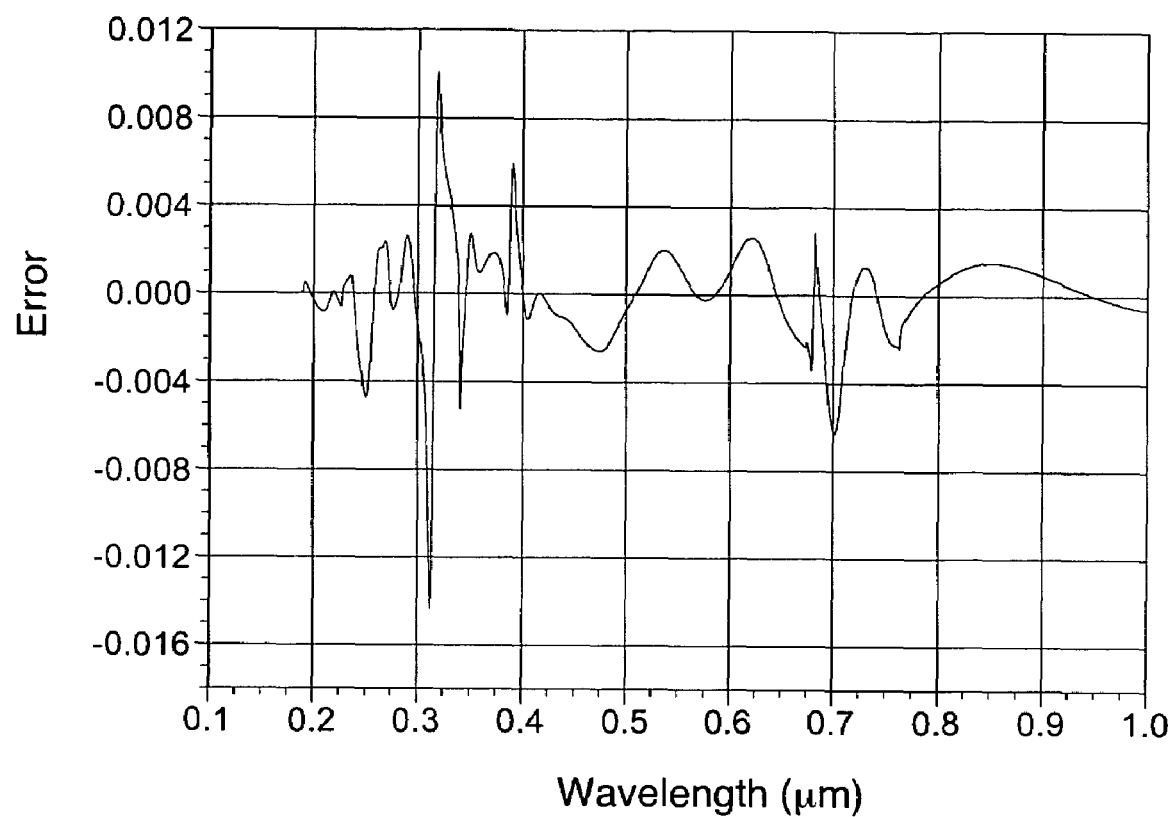
FIG. 13 is a plot of reflectivity error introduced by a 0.5 degree angular alignment error in two measurements.

FIG. 13 shows the error (i.e., $R_0(180°)-R_0(180.5°)$) introduced by a 0.5 degree azimuthal angle change in the example of FIG. 6 with δ=30 nm. From FIG. 13, it is evident that this error is considerably smaller than the typical ΔR of earlier examples.

A more quantitative estimate of the effect of a 0.5 degree angular error can be obtained by revisiting the linear approximation of FIGS. 9 and 10 with $\phi_2=\phi_1+180.5°$. With this change in $\phi_2$, we now have $\Delta R_1$=−0.01948 and $\Delta R_2$=0.037299, where these quantities are averaged over a wavelength range from 701 nm to 740 nm. Repeating the calculations of FIGS. 9 and 10 gives a slope s=0.001262/nm and offset estimates $\delta_1=\Delta R_1/s$=−15.44 nm and $\delta_2=\Delta R_2/s$=29.56 nm. Recall that the calculations of FIGS. 9 and 10 provided estimates of $\delta_1$=−15.23 nm and $\delta_2$=29.76 nm. Thus the error introduced in these estimates by a 0.5 degree azimuthal error is small compared to the difference between the estimates and the true offsets ($\delta_1$=−15 nm and $\delta_2$=30 nm). Thus, in this example, a 0.5 degree azimuthal angle error has a negligible effect on accuracy. From FIG. 13, it is apparent that wavelength averaging can act to reduce the effect of an azimuthal angle error, since the plotted error changes sign in the exemplary range from 701 nm to 740 nm.

The preceding description has been by way of example as opposed to limitation. Many variations of the above examples also fall within the scope of the invention. For example, the above description relates to determination of offset in a single direction. Such methods can also be extended to the determination of offsets in two or more directions. It is often desired to obtain offset measurements in two orthogonal directions (e.g., horizontal and vertical). This can be accomplished by providing two compound grating structures having orthogonal lines in test areas of the wafer, and performing measurements on each of these compound gratings as indicated above. Although the above examples all have s-polarized incident light, p-polarized incident light can also be used to practice the invention.

What is claimed is:

1. A system for measuring a lateral offset between a first layer in proximity to and parallel to a second layer, the system comprising:

a) a first grating having first grating lines in the first layer;

b) a second grating having second grating lines in the second layer, wherein the first and second grating lines are substantially perpendicular to a common grating axis, wherein the first and second gratings at least partially overlap;

c) an optical source providing incident light to the first and second gratings, the incident light having an angle of incidence θ greater than zero and having a plane of incidence making an azimuthal angle $\phi$ with the grating axis, wherein φ is selectable to have either of two values $\phi_1$ or $\phi_2=\phi_1+180°$, wherein $\phi_1$ is not an integer multiple of 90°;

d) an optical detector receiving diffracted light from the first and second gratings and providing a first optical response when $\phi=\phi_1$ and providing a second optical response when $\phi=\phi_2$;

e) a processor for providing a first difference $\Delta R_1$ between the first and second optical responses, wherein $\Delta R_1$ depends in part on the offset between the first and second layers.

2. The system of claim 1, wherein said first and second optical responses are zero order reflectances.

3. The system of claim 1, wherein said angle of incidence θ is between about 40° and about 50°.

4. The system of claim 1, wherein said azimuthal angle of incidence $\phi_1$ is about equal to an odd integer multiple of 45°.

5. The system of claim 1, wherein said first and second gratings have substantially the same period.

6. The system of claim 5 further comprising:
a compound grating comprising said first and second gratings, wherein the compound grating has reflection symmetry about a reflection plane perpendicular to said grating axis when said offset is zero.

7. The system of claim 6, wherein said first and second gratings have a line-on-space alignment when said offset is zero.

8. The system of claim 1, further comprising:
f) a third grating having third grating lines in the first layer, wherein the third grating lines are substantially perpendicular to said common grating axis;

g) a fourth grating having fourth grating lines in the second layer, wherein the fourth grating lines are substantially perpendicular to said common grating axis;

h) a first compound grating comprising said first and second gratings;

i) a second compound grating comprising said third and fourth gratings;

wherein said incident light is provided to the third and fourth gratings;

wherein said optical detector receives diffracted light from the third and fourth gratings and provides a third optical response when $\phi=\phi_1$ and provides a fourth optical response when $\phi=\phi_2$;

wherein said processor provides a second difference $\Delta R_2$ between the third and fourth optical responses, wherein $\Delta R_2$ depends in part on said offset between the first and second layers;

wherein the first and second compound gratings have respective offsets $\delta_1$ and $\delta_2$ having a predetermined non-zero offset difference $\Delta=\delta_2-\delta_1$;

wherein said processor provides an estimate of the offsets $\delta_1$ and $\delta_2$ based on said differences $\Delta R_1$, $\Delta R_2$, and $\Delta$.

9. The system of claim 8, wherein said first, second, third and fourth optical responses are zero order reflectances.

10. The system of claim 8, wherein said first, second, third and fourth gratings have substantially the same period.

11. The system of claim 8, wherein said estimate of said offsets is provided by calculating a slope $s=(\Delta R_2-\Delta R_1)/\Delta$, providing $\Delta R_1/s$ as an estimate of $\delta_1$, and providing $\Delta R_2/s$ as an estimate of $\delta_2$.

12. A method for measuring a lateral offset between a first layer in proximity to and parallel to a second layer, the method comprising:

a) providing a first grating having first grating lines in the first layer;

b) providing a second grating having second grating lines in the second layer, wherein the first and second grating lines are substantially perpendicular to a common grating axis, wherein the first and second gratings at least partially overlap;

c) first illuminating the first and second gratings with light having an angle of incidence θ greater than zero and having a first plane of incidence making a first azimuthal angle $\phi_1$ with the grating axis, wherein $\phi_1$ is not an integer multiple of 90°;

d) first measuring a first optical response from the first and second gratings responsive to the first illuminating;

e) second illuminating the first and second gratings with light having the angle of incidence θ and having a second plane of incidence making a second azimuthal angle $\phi_2=\phi_1+180°$ with the grating axis;

f) second measuring a second optical response from the first and second gratings responsive to the second illuminating;

g) forming a first difference $\Delta R_1$ between the first and second optical responses, wherein $\Delta R_1$ depends in part on the offset between the first and second layers.

13. The method of claim 12, wherein said first and second optical responses are zero order reflectances.

14. The method of claim 12, wherein said angle of incidence θ is between about 40° and about 50°.

15. The method of claim 12, wherein said azimuthal angle of incidence $\phi_1$ is about equal to an odd integer multiple of 45°.

16. The method of claim 12, wherein said first and second gratings have substantially the same period.

17. The method of claim 16 wherein said first and second gratings are included in a compound grating, wherein the compound grating has reflection symmetry about a reflection plane perpendicular to said grating axis when said offset is zero.

18. The method of claim 17, wherein said first and second gratings have a line-on-space alignment when said offset is zero.

19. The method of claim 12, further comprising:

h) providing a third grating having third grating lines in the first layer; wherein the third grating lines are substantially perpendicular to said common grating axis;

i) providing a fourth grating having fourth grating lines in the second layer, wherein the fourth grating lines are substantially perpendicular to said common grating axis;

j) third illuminating the third and fourth gratings with light having said angle of incidence θ and having a plane of incidence making said azimuthal angle $\phi_1$ with said grating axis;

k) third measuring a third optical response from the third and fourth gratings responsive to the third illuminating;

l) fourth illuminating the third and fourth gratings with light having said angle of incidence θ and having a plane of incidence making said azimuthal angle $\phi_2$ with said grating axis;

m) fourth measuring a fourth optical response from the third and fourth gratings responsive to the fourth illuminating;

n) forming a second difference $\Delta R_2$ between the third and fourth optical responses, wherein $\Delta R_2$ depends in part on said offset between the first and second layers;

o) providing an estimate of said offset based on said first and second differences;

wherein said first and second gratings are included in a first compound grating and the third and fourth gratings are included in a second compound grating;

wherein the first and second compound gratings have respective offsets $\delta_1$ and $\delta_2$ having a predetermined non-zero offset difference $\Delta = \delta_2 - \delta_1$.

20. The method of claim 19, wherein said first, second, third and fourth optical responses are zero order reflectances.

21. The method of claim 19, wherein said first, second, third and fourth gratings have substantially the same period.

22. The system of claim 19, wherein said estimate of said offset is provided by calculating a slope $s = (\Delta R_2 - \Delta R_1)/\Delta$, providing $\Delta R_1/s$ as an estimate of $\delta_1$, and providing $\Delta R_2 s$ as an estimate of $\delta_2$.

* * * * *